United States Patent
Furuhata

(10) Patent No.: US 9,397,171 B2
(45) Date of Patent: Jul. 19, 2016

(54) SEMICONDUCTOR DEVICE AND MANUFACTURING METHOD FOR THE SAME

(71) Applicant: SEIKO EPSON CORPORATION, Tokyo (JP)

(72) Inventor: Tomoyuki Furuhata, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/628,877

(22) Filed: Feb. 23, 2015

(65) Prior Publication Data

US 2015/0243741 A1 Aug. 27, 2015

(30) Foreign Application Priority Data

Feb. 24, 2014 (JP) ................. 2014-032745

(51) Int. Cl.
*H01L 29/36* (2006.01)
*H01L 21/8238* (2006.01)
*H01L 27/092* (2006.01)

(52) U.S. Cl.
CPC ........ *H01L 29/36* (2013.01); *H01L 21/823814* (2013.01); *H01L 21/823892* (2013.01); *H01L 27/0922* (2013.01)

(58) Field of Classification Search
None
See application file for complete search history.

(56) References Cited

U.S. PATENT DOCUMENTS

| 6,864,543 B2 | 3/2005 | Kaneko et al. |
| 6,903,424 B2 | 6/2005 | Ookubo et al. |
| 7,402,474 B2 | 7/2008 | Ogura |
| 7,884,426 B2 | 2/2011 | Yoda |
| 7,972,917 B2 | 7/2011 | Furuhata et al. |
| 2005/0087835 A1 | 4/2005 | Hayashi et al. |
| 2005/0263843 A1 | 12/2005 | Sakakibara |
| 2011/0303977 A1* | 12/2011 | Huang ............... H01L 21/8249 257/339 |
| 2015/0214222 A1* | 7/2015 | Wang ............... H01L 27/088 257/337 |

FOREIGN PATENT DOCUMENTS

| JP | 2003-197790 A | 7/2003 |
| JP | 2003-234423 A | 8/2003 |
| JP | 2005-116744 A | 4/2005 |
| JP | 2006-013450 A | 1/2006 |
| JP | 2006-100579 A | 4/2006 |
| JP | 2007-142096 A | 6/2007 |
| JP | 2010-016153 A | 1/2010 |

* cited by examiner

*Primary Examiner* — Evren Seven
*Assistant Examiner* — Steven Christopher
(74) *Attorney, Agent, or Firm* — Oliff PLC

(57) ABSTRACT

A semiconductor device according to the invention includes an epitaxial layer of a first conductivity type, a first well of a second conductivity type to which a first potential is applied, a second well of the second conductivity type to which a second potential that differs from the first potential is applied, a third well of the first conductivity type provided in the epitaxial layer between the first well and the second well, a first impurity region of the first conductivity type provided in the epitaxial layer under the first well, a first MOS transistor provided in the first well, a second MOS transistor provided in the second well, and a third MOS transistor provided in the third well, the first impurity region having a higher impurity concentration than the epitaxial layer.

17 Claims, 16 Drawing Sheets

SEMICONDUCTOR DEVICE AND MANUFACTURING METHOD FOR THE SAME

CROSS REFERENCE

The entire disclose of Japanese Patent Application No. 2014-032745, filed Feb. 24, 2014, is expressly incorporated by reference herein.

BACKGROUND

1. Technical Field

The present invention relates to a semiconductor device and a manufacturing method for the same.

2. Related Art

In recent years, semiconductor devices in which a plurality of transistors are mounted together on the same semiconductor substrate for purposes such as changing electric current consumption according to an operating state of the apparatus have been attracting attention.

For example, JP-A-2010-16153 describes a semiconductor device in which a first MOS (Metal Oxide Semiconductor) transistor, a second MOS transistor, an LDMOS (Laterally Diffused MOS) transistor and the like are mounted together on a semiconductor substrate. In the semiconductor device described in JP-A-2010-16153, a P-type well and an N-type well are provided in a P-type semiconductor substrate, with the first MOS transistor being provided in the P-type well, and the second MOS transistor being provided in the N-type well. Also, in semiconductor devices in which a P-type well and an N-type well are provided in a P-type semiconductor substrate, a further N-type well may be provided in the semiconductor substrate, and a third MOS transistor may be provided at this N-type well, in order to support operating states of the apparatus, for example.

However, in the case where two N-type wells are provided in a P-type semiconductor substrate as described above, leakage current may occur between the two N-type wells when the potential that is applied to one of the N-type wells differs from the potential that is applied to the other N-type well.

SUMMARY

An advantage of some aspects of the invention is to provide a semiconductor device that is able to suppress the occurrence of leakage current between wells. A further advantage of some aspects of the invention is to provide a method for manufacturing a semiconductor device that is able to suppress the occurrence of leakage current between wells.

These and other advantages can be realized as the following modes or application examples.

Application Example 1

One mode of a semiconductor device according to the invention includes a semiconductor substrate, an epitaxial layer of a first conductivity type grown epitaxially on the semiconductor substrate, a first well of a second conductivity type provided in the epitaxial layer and to which a first potential is applied, a second well of the second conductivity type provided in the epitaxial layer and to which a second potential that differs from the first potential is applied, a third well of the first conductivity type provided in the epitaxial layer between the first well and the second well, a first impurity region of the first conductivity type provided in the epitaxial layer under the first well, a first MOS transistor provided in the first well, a second MOS transistor provided in the second well, and a third MOS transistor provided in the third well, the first impurity region having a higher impurity concentration than the epitaxial layer.

In such a semiconductor device, the first impurity region enables the occurrence of leakage current between the first well and the second well to be suppressed. Furthermore, in such a semiconductor device, the third well enables the occurrence of leakage current between the first well and the second well to be suppressed.

Application Example 2

In application example 1, the first impurity region may be provided under the second well and under the third well.

In such a semiconductor device, the occurrence of leakage current between the first well and the second well can be more reliably suppressed.

Application Example 3

In application example 1 or 2, the semiconductor device according to claim 1 may include a second impurity region of the second conductivity type provided in the epitaxial layer, and the second impurity region may include a first portion provided under the first impurity region, and a second portion connected to the first portion and provided surrounding the first well, the second well and the third well in plan view.

In such a semiconductor device, the first impurity region enables the occurrence of leakage current between the first portion and the first well to be suppressed.

Application Example 4

In application example 3, the semiconductor device may include a fourth well of the first conductivity type provided in the epitaxial layer between the second portion and the first well, a fifth well of the first conductivity type provided in the epitaxial layer between the second portion and the second well, a fourth MOS transistor provided in the fourth well, and a fifth MOS transistor provided in the fifth well.

In such a semiconductor device, the fourth well enables the occurrence of leakage current between the second portion and the first well to be suppressed. Furthermore, in such a semiconductor device, the fifth well enables the occurrence of leakage current between the second portion and the second well to be suppressed.

Application Example 5

In application example 3 or 4, the semiconductor device may include a sixth well of the second conductivity type provided in the epitaxial layer outside the second portion in plan view, a third impurity region of the second conductivity type provided surrounding the sixth well in plan view, and an LDMOS transistor provided in the sixth well.

In such a semiconductor device, the third impurity region is able to electrically separate the sixth well from the epitaxial layer, and such a third impurity region and the second impurity region can be formed in the same process.

Application Example 6

In any one of application examples 1 to 5, the first well may be provided inside an outer edge of the first impurity region in plan view.

In such a semiconductor device, the occurrence of leakage current between the first well and the second well can be more reliably suppressed.

Application Example 7

In any one of application examples 1 to 6, a gate insulating film of the first MOS transistor may differ in thickness from a gate insulating film of the second MOS transistor.

With such a semiconductor device, in the case where, for example, the voltage that is applied between the gate electrode of the second MOS transistor and the second well is higher than the voltage that is applied between the gate electrode of the first MOS transistor and the first well, the gate insulating film of the second MOS transistor can be configured to be thicker than the gate insulating film of the first MOS transistor. The second MOS transistor to which the high voltage is applied can thereby be configured to have a higher breakdown voltage.

Application Example 8

One mode of a method for manufacturing a semiconductor device according to the invention includes forming a first impurity region of a first conductivity type in an epitaxial layer of the first conductivity type grown epitaxially on a semiconductor substrate, forming a first well of a second conductivity type in the epitaxial layer on the first impurity region, a second well of the second conductivity type in the epitaxial layer and a third well of the first conductivity type in the epitaxial layer between the first well and the second well, and forming a first MOS transistor in the first well, a second MOS transistor in the second well and a third MOS transistor in the third well. A first potential is applied to the first well, a second potential that differs from the first potential is applied to the second well, and in forming the first impurity region, the first impurity region is formed to have a higher impurity concentration than the epitaxial layer.

With such a method for manufacturing a semiconductor device, a semiconductor device that is able to suppress the occurrence of leakage current between the first well and the second well with the first impurity region can be manufactured. Furthermore, with such a method for manufacturing a semiconductor device, a semiconductor device that is able to suppress the occurrence of leakage current between the first well and the second well with the third well can be manufactured.

In this specification, the wording "on (under)" in a sentence such as "one specific member (hereinafter, "B") is provided on (under) another specific member (hereinafter, "A")", for example, is to be understood as including the case where B is provided on (under) A via another member(s) as long as the operations and effects of the invention are not inhibited.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. Note that the embodiments described below are not intended to unduly limit the scope of the invention as defined in the claims, and not all of the constituent elements described below are essential to the invention.

1. Semiconductor Device

Figure 1:
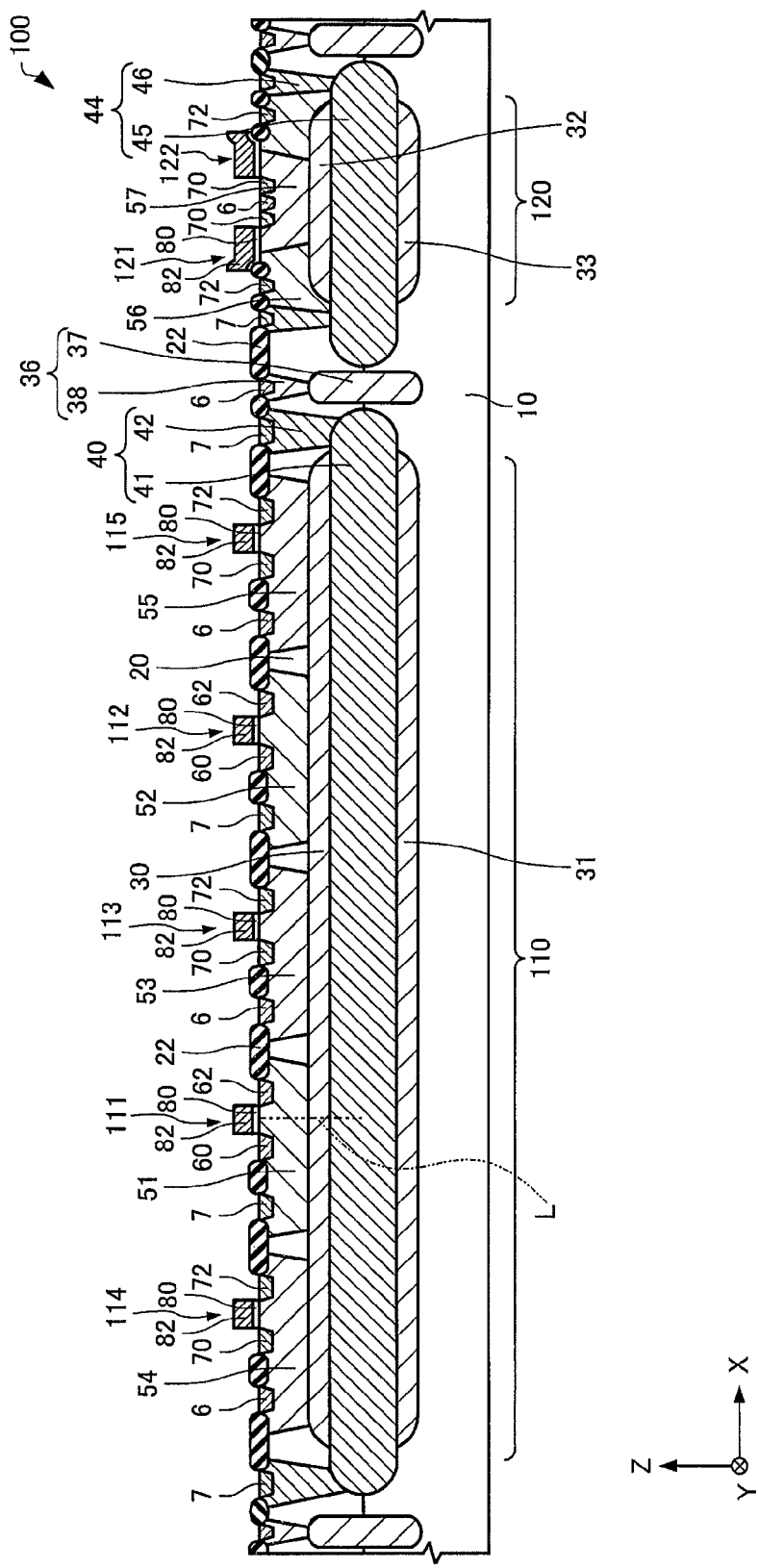
FIG. 1 is a cross-sectional view schematically showing a semiconductor device according to an embodiment.
Figure 2:
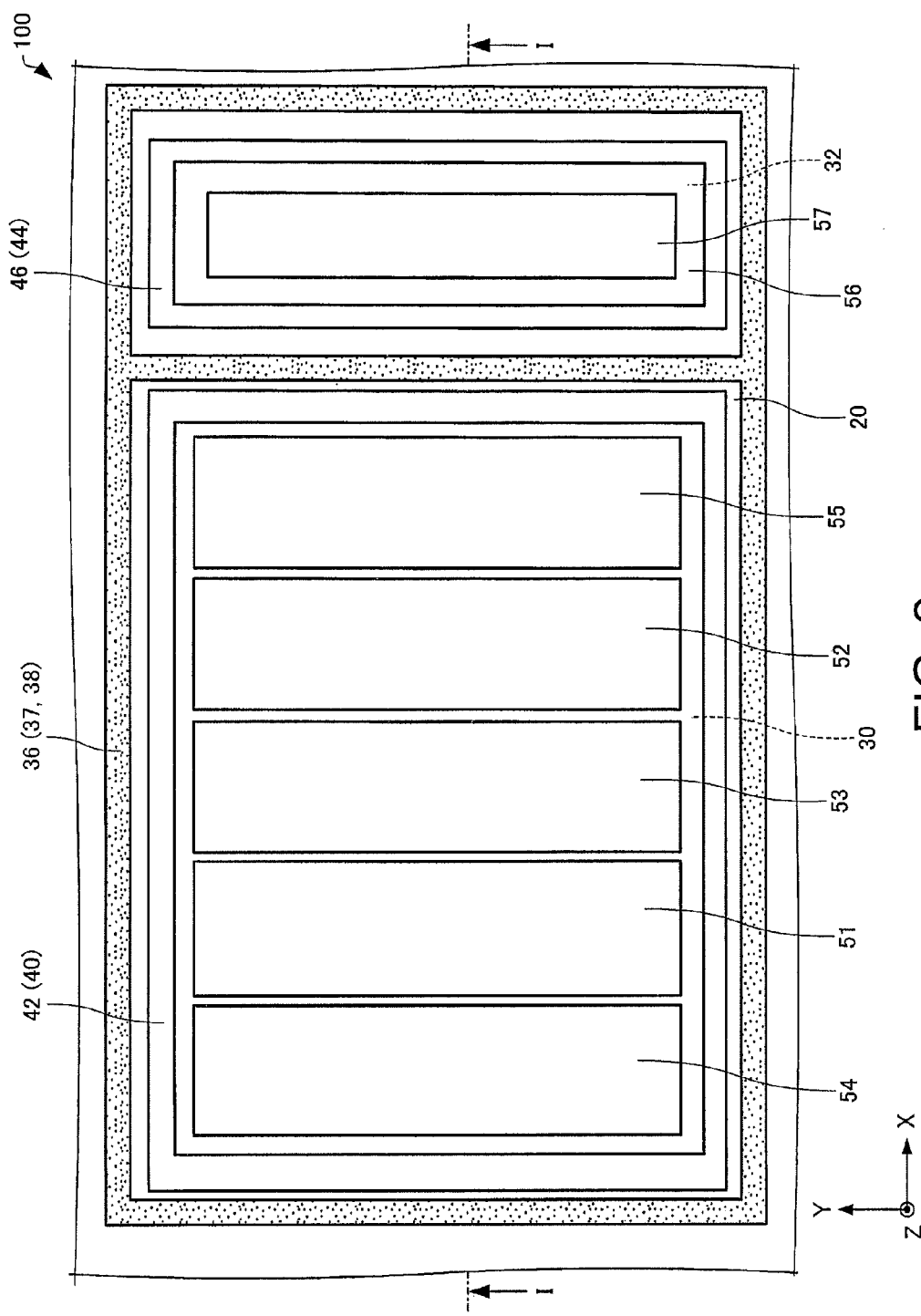
FIG. 2 is a plan view showing the semiconductor device according to the embodiment.

First, a semiconductor device according to the present embodiment will be described with reference to the drawings. FIG. 1 is a cross-sectional view schematically showing a semiconductor device 100 according to the present embodiment. FIG. 2 is a plan view schematically showing the semiconductor device 100 according to the present embodiment. Note that FIG. 1 is a cross-sectional view along a line I-I in FIG. 2. Also, in FIGS. 1 and 2, the X-axis, the Y-axis and the Z-axis are illustrated as three axes that intersect each other orthogonally.

As shown in FIGS. 1 and 2, the semiconductor device 100 includes a semiconductor substrate 10, an epitaxial layer 20, impurity regions 30, 32, 40 and 44, wells 51, 52, 53, 54, 55 and 56, MOS transistors 111, 112, 113, 114 and 115, and LDMOS transistors 121 and 122.

Note that, in FIG. 2, illustration of constituent elements other than the epitaxial layer 20, the impurity regions 30, 32, 40 and 44, the wells 51, 52, 53, 54, 55 and 56, and a body region 57 of the LDMOS transistors 121 and 122 is omitted for the sake of convenience.

The semiconductor substrate 10 is a silicon substrate of a first conductivity type (e.g., P-type).

The epitaxial layer 20 is provided on the semiconductor substrate 10. The epitaxial layer 20 is grown epitaxially on the semiconductor substrate 10. The epitaxial layer 20 is grown to have the same crystal structure as the semiconductor substrate 10, for example. The epitaxial layer 20 is a silicon layer of the first conductivity type (e.g., P-type). The epitaxial layer 20 may have the same impurity concentration as the semiconductor substrate 10.

An insulating layer 22 is provided on an upper surface of the epitaxial layer 20. The insulating layer 22 is a LOCOS (Local Oxidation of Silicon) layer, a semi-recessed LOCOS layer or a trench insulating layer, for example.

The semiconductor device 100 has a MOS formation region 110 in which the MOS transistors 111, 112, 113, 114 and 115 are formed, and an LDMOS formation region 120 in which the LDMOS transistors 121 and 122 are formed. Hereinafter, the MOS formation region 110 and the LDMOS formation region 120 will be specifically described.

1.1. MOS Formation Region

The first impurity region 30, the first well 51, the second well 52, the third well 53, the fourth well 54, the fifth well 55, the first MOS transistor 111, the second MOS transistor 112, the third MOS transistor 113, the fourth MOS transistor 114, and the fifth MOS transistor 115 are provided in the MOS formation region 110. The MOS formation region 110 is surrounded by the second portion 42 of the second impurity region 40 in plan view (e.g., as seen from a thickness direction of the semiconductor substrate 10).

The second impurity region 40 is provided in the semiconductor substrate 10 and the epitaxial layer 20. The second impurity region 40 is an impurity region of a second conductivity type (e.g., N-type) that differs from the first conductivity type. The second impurity region 40 has a first portion 41 and a second portion 42.

The first portion 41 of the second impurity region 40 is provided in the semiconductor substrate 10 and the epitaxial layer 20. The first portion 41 is provided under the first impurity region 30. The second portion 42 of the second impurity region 40 is connected to the first portion 41. The second portion 42 is provided surrounding the wells 51, 52, 53, 54 and 55 in plan view. The second impurity region 40 is able to electrically separate the MOS formation region 110 from other portions.

The first impurity region 30 is provided in the epitaxial layer 20 on the first portion 41 of the second impurity region 40. The first impurity region 30 is provided in the epitaxial layer 20 under the wells 51, 52, 53, 54 and 55. That is, the first impurity region 30 is provided between the first portion 41 and the wells 51, 52, 53, 54 and 55. In the illustrated example, the first impurity region 30 is in contact with the first portion 41 and the wells 51, 52, 53, 54 and 55. Note that although such a configuration is not illustrated, the first impurity region 30 may be provided under only the first well 51.

Figure 3:
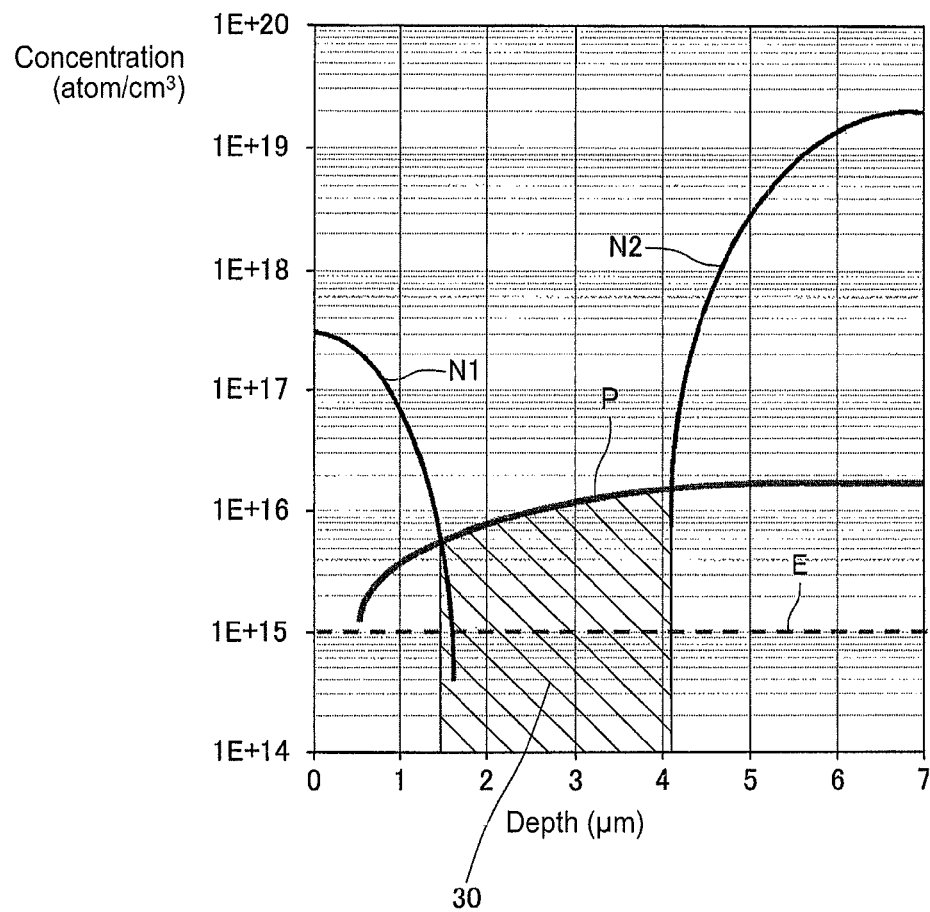
FIG. 3 shows an exemplary impurity concentration profile in a depth direction of the semiconductor device according to the embodiment.

The first impurity region 30 is an impurity region of the first conductivity type (e.g., P-type). Here, FIG. 3 shows an exemplary impurity concentration profile of a virtual line segment L shown in FIG. 1 in the depth direction (thickness direction). In FIG. 3, 0 on the horizontal axis is equivalent to the position of the upper surface of the first well 51. In FIG. 3, the concentration profile of the N-type impurity that is implanted in order to form the first well 51 is given as N1, the concentration profile of the N-type impurity that is implanted in order to form the first portion 41 of the second impurity region 40 is given as N2, and the concentration profile of the P-type impurity that is implanted in order to form the first impurity region 30 is given as P. Also, a dotted line E in FIG. 3 indicates the impurity concentration of the epitaxial layer 20 (e.g., the impurity concentration of the epitaxial layer 20 in the line segment L before the first well 51 and the impurity regions 30 and 40 are formed).

The first impurity region 30 has a higher impurity concentration than the epitaxial layer 20, as shown in FIG. 3. In the example shown in FIG. 3, the first impurity region 30 will be formed in the region shown by the diagonal lines. As shown in FIG. 3, the first impurity region 30 may be formed in a region that contains N-type impurities. For example, the first impurity region 30 will be formed in a region in which the concentration of the impurity that is implanted in order to form the first well 51, or the concentration of the impurity that is implanted in order to form the first portion 41 of the second impurity region 40 is lower than the concentration of the impurity that is implanted in order to form the first impurity region 30. In the example shown in FIG. 3, the electrical resistivity of the epitaxial layer 20 is about 10 Ωcm, for example.

Note that, in the example shown in FIG. 1, an impurity region 31 that is formed in the semiconductor substrate 10 under the first portion 41 of the second impurity region 40 in the same process as the first impurity region 30 is provided.

The wells 51, 52, 53, 54 and 55 are provided in the epitaxial layer 20 on the first impurity region 30. In the illustrated example, the wells 51, 52, 53, 54 and 55 are arrayed in the stated order in a direction (X-axis direction) orthogonal to the thickness direction (Z-axis direction) of the semiconductor substrate 10. Although the planar shape of the wells 51, 52, 53, 54 and 55 (e.g., shape as seen from the thickness direction of the semiconductor substrate 10) is rectangular in the example shown in FIG. 2, the shape of the wells is not particularly limited. The wells 51, 52, 53, 54 and 55 are provided inside the outer edge of the first impurity region 30 in plan view.

The wells 51 and 52 are wells of the second conductivity type (e.g., N-type). A first potential (e.g., about 3 V) is applied to the first well 51. A second potential (e.g., about 5 V) that differs from the first potential is applied to the second well 52. In the example shown in FIG. 1, an N-type impurity region 7 is provided in each of the wells 51 and 52. The impurity region 7 has a higher impurity concentration than the wells 51 and 52, for example, and a potential can be applied to the wells 51 and 52 via the impurity region 7.

The wells 53, 54 and 55 are wells of the first conductivity type (e.g., P-type). The third well 53 is provided in the epitaxial layer 20 between the first well 51 and the second well 52. The fourth well 54 is provided in the epitaxial layer 20 between the second portion 42 of the second impurity region 40 and the first well 51. The fifth well 55 is provided in the epitaxial layer 20 between the second portion 42 and the second well 52. A reference potential (ground potential), for example, is applied to the wells 53, 54 and 55. The wells 53, 54 and 55 are grounded, for example. In the illustrated example, a P-type impurity region 6 is provided in each of the wells 53, 54 and 55. The impurity region 6 has a higher impurity concentration than the wells 53, 54 and 55, for example, and a potential can be applied to the wells 53, 54 and 55 via the impurity region 6.

The first MOS transistor 111 is provided in the first well 51. The second MOS transistor 112 is provided in the second well 52. The MOS transistors 111 and 112 have a P-type impurity region 60 serving as a source, a P-type impurity region 62 serving as a drain, a gate insulating film 80, and a gate electrode 82. The gate insulating film 80 is made of silicon oxide, for example. The gate electrode 82 is made of polysilicon doped with an impurity, for example. A P-type channel region (not shown) is formed in the wells 51 and 52.

A first voltage that is applied between the gate electrode 82 of the first MOS transistor 111 and the first well 51 may differ from a second voltage that is applied between the gate electrode 82 of the second MOS transistor 112 and the second well 52. For example, the first voltage is about 3 V and the second voltage is about 5 V. In this case, the gate insulating film 80 of the second MOS transistor 112 may be thicker than the gate insulating film 80 of the first MOS transistor 111. That is, the thickness of the gate insulating film 80 of the first MOS transistor 111 may differ from the thickness of the gate insulating film 80 of the second MOS transistor 112. For example, the thickness of the gate insulating film 80 of the first MOS transistor 111 is 5 nm to 10 nm inclusive, and the thickness of the gate insulating film 80 of the second MOS transistor 112 is 10 nm to 25 nm inclusive.

The third MOS transistor 113 is provided in the third well 53. The fourth MOS transistor 114 is provided in the fourth well 54. The fifth MOS transistor 115 is provided in the fifth well 55. The MOS transistors 113, 114 and 115 have an N-type impurity region 70 serving as a source, an N-type impurity region 72 serving as a drain, a gate insulating film 80, and a gate electrode 82. An N-type channel region (not shown) is formed in the wells 53, 54 and 55.

A third voltage that is applied between the gate electrode 82 of the third MOS transistor 113 and the third well 53 may differ from a fourth voltage that is applied between the gate electrode 82 of the fourth MOS transistor 114 and the fourth well 54 and a fifth voltage that is applied between the gate electrode 82 of the fifth MOS transistor 115 and the fifth well 55. For example, the third voltage is about 5 V and the fourth and fifth voltages are about 3 V. In this case, the gate insulating film 80 of the third MOS transistor 113 may be thicker than the gate insulating film 80 of the fourth MOS transistor 114 and the gate insulating film 80 of the fifth MOS transistor 115. That is, the thickness of the gate insulating film 80 of the third MOS transistor 113 may differ from the thickness of the gate insulating film 80 of the fourth MOS transistor 114 and the thickness of the gate insulating film 80 of the fifth MOS transistor 115. For example, the thickness of the gate insulating film 80 of the third MOS transistor 113 is 10 nm to 25 nm inclusive, and the thickness of the gate insulating film 80 of the fourth MOS transistor 114 and the thickness of the gate insulating film 80 of the fifth MOS transistor 115 are 5 nm to 10 nm inclusive.

The MOS transistors 111, 112, 113, 114 and 115 are each provided so as to be surrounded by the insulating layer 22 in plan view, for example. The MOS transistors 111, 112, 113, 114 and 115 can thereby be electrically separated from each other.

Note that although five MOS transistors are provided in the MOS formation region 110 in the illustrated example, the number of MOS transistors is not particularly limited.

1.2. LDMOS Formation Region

The LDMOS formation region 120 is a region surrounded by a fourth portion 46 of the third impurity region 44 in plan view. The fourth impurity region 32, the sixth well 56, the first LDMOS transistor 121 and the second LDMOS transistor 122 are provided in the LDMOS formation region 120.

The third impurity region 44 is provided in the semiconductor substrate 10 and the epitaxial layer 20 outside the second portion 42 of the second impurity region in plan view. The third impurity region 44 is an impurity region of the second conductivity type (e.g., N-type). The third impurity region 44 is formed in the same process as the second impurity region 40, for example. The third impurity region 44 has a third portion 45 and the fourth portion 46.

The third portion 45 of the third impurity region 44 is provided in the semiconductor substrate 10 and the epitaxial layer 20. The third portion 45 is provided under the fourth impurity region 32. The fourth portion 46 of the third impurity region 44 is connected to the third portion 45. The fourth portion 46 is provided surrounding the sixth well 56 in plan view. The third impurity region 44 is able to electrically separate the sixth well 56 from the epitaxial layer 20.

The fourth impurity region 32 is provided in the epitaxial layer 20 on the third portion 45 of the third impurity region 44. The fourth impurity region 32 is provided between the third portion 45 and the sixth well 56 and between the third portion 45 and the body region 57. The fourth impurity region 32 is an impurity region of the first conductivity type (e.g., P-type). The fourth impurity region 32 is formed in the same process as the first impurity region 30, for example.

Note that, in the example shown in FIG. 1, an impurity region 33 that is formed in the same process as the fourth impurity region 32 is provided under the third portion 45 of the third impurity region 44.

The sixth well 56 is provided in the epitaxial layer 20 outside the second portion 42 of the second impurity region 40 in plan view. The fourth portion 46 of the third impurity region 44 is provided surrounding the sixth well 56 in plan view. The sixth well 56 is a well of the second conductivity type (e.g., N-type). In the example shown in FIG. 1, the sixth well 56 is deeper (thicker) than the wells 51, 52, 53, 54 and 55.

The LDMOS transistors 121 and 122 are provided in the sixth well 56. The LDMOS transistors 121 and 122 have the body region 57, an N-type impurity region 70 serving as a source, an N-type impurity region 72 serving as a drain, a gate insulating film 80, and a gate electrode 82.

The LDMOS transistors 121 and 122 have one body region 57 as a common body region, for example. The body region 57 is provided so as to be surrounded by the sixth well 56 in plan view. The body region 57 is an impurity region of the first conductivity type (e.g., P-type). An N-type channel region (not shown) is formed near the upper surface of the body region 57. In the illustrated example, the P-type impurity region 6 is provided in the body region 57. The impurity region 6 has a higher impurity concentration than the body region 57, for example, and a potential can be applied to the body region 57 via the impurity region 6.

The impurity regions 70 of the LDMOS transistors 121 and 122 are provided in the body region 57. The impurity regions 72 of the LDMOS transistors 121 and 122 are provided in the sixth well 56. The gate electrodes 82 of the LDMOS transistors 121 and 122 are provided above the body region 57 and above the insulating layer 22 provided in the sixth well 56. In the LDMOS transistors 121 and 122, a drain is constituted by the impurity region 72 and the sixth well 56, enabling on-resistance to be reduced by substantially reducing resistance in the lateral direction (X-axis direction).

Note that although two LDMOS transistors are provided in the LDMOS formation region 120 in the illustrated example, the number of LDMOS transistors is not particularly limited.

As shown in FIGS. 1 and 2, the fifth impurity region 36 may be provided in the semiconductor substrate 10 and the epitaxial layer 20 between the second impurity region 40 and the third impurity region 44. The fifth impurity region 36 is provided surrounding the second impurity region 40 and the third impurity region 44 in plan view; for example. The fifth impurity region 36 is an impurity region of the first conductivity type (P-type). The fifth impurity region 36 has a fifth portion 37 provided in the semiconductor substrate 10 and the epitaxial layer 20, and a sixth portion 38 provided from the fifth portion 37 to the upper surface of the epitaxial layer 20. In the illustrated example, the P-type impurity region 6 is provided in the sixth portion 38. The impurity region 6 has a higher impurity concentration than the fifth impurity region 36, for example, and a potential can be applied to the fifth impurity region 36 via the impurity region 6. A reference potential (ground potential), for example, is applied to the fifth impurity region 36. The fifth impurity region 36 is grounded, for example.

The semiconductor device 100 has the following features, for example.

The semiconductor device 100 includes the impurity region 30 of the first conductivity type provided in the epitaxial layer 20 under the first well 51, and the first impurity region 30 has a higher impurity concentration than the epitaxial layer 20. Thus, in the semiconductor device 100, the first impurity region 30 enables the occurrence of leakage current between the first well 51 of the second conductivity type and the second well 52 of the second conductivity type to be suppressed. For example, in the case where the first impurity region is not provided, leakage current may occur between wells of the second conductivity type via an epitaxial layer of the first conductivity type. Furthermore, the semiconductor device 100 includes the third well 53 of the first conductivity type provided in the epitaxial layer 20 between the first well 51 and the second well 52. Thus, in the semiconductor device 100, the third well 53 enables the occurrence of leakage current between the first well 51 and the second well 52 to be suppressed. Furthermore, since the distance between the first well 51 and the second well 52 does not need to be increased in order to prevent the occurrence of leakage current between the first well 51 and the second well 52, miniaturization of the semiconductor device 100 can be achieved.

Note that when the impurity concentration of the epitaxial layer is increased in order to suppress the occurrence of leakage current between the wells of the second conductivity type, for example, the impurity concentration of the wells that are provided in the epitaxial layer must also be increased, leading to a reduction in the design flexibility of semiconductor devices.

In the semiconductor device 100, the first impurity region 30 is provided under the second well 52 and under the third well 53. Thus, in the semiconductor device 100, the occurrence of leakage current between the first well 51 and the second well 52 can be more reliably suppressed. Furthermore, in the semiconductor device 100, the occurrence of leakage current between the first portion 41 of the second impurity region 40 and the second well 52 can be suppressed.

In the semiconductor device 100, the second impurity region 40 has the first portion 41 provided under the first impurity region 30. Thus, in the semiconductor device 100, the first impurity region 30 enables the occurrence of leakage current between the first portion 41 and the first well 51 to be suppressed.

The semiconductor device 100 includes the fourth well 54 of the first conductivity type provided in the epitaxial layer 20 between the second portion 42 of the second impurity region 40 and the first well 51. Thus, in the semiconductor device 100, the fourth well 54 enables the occurrence of leakage current between the second portion 42 and the first well 51 to be suppressed. Furthermore, the semiconductor device 100 includes the fifth well 55 of the first conductivity type provided in the epitaxial layer 20 between the second portion 42 and the second well 52. Thus, in the semiconductor device 100, the fifth well 55 enables the occurrence of leakage current between the second portion 42 and the second well 52 to be suppressed.

The semiconductor device 100 includes the third impurity region 44 of the second conductivity type provided surrounding the sixth well 56 in plan view. Thus, the third impurity region 44 is able to electrically separate the sixth well 56 from the epitaxial layer 20. In the semiconductor device 100, such a third impurity region 44 and the second impurity region 40 can be formed in the same process.

In the semiconductor device 100, the first well 51 is provided inside the outer edge of the first impurity region 30 in plan view. Thus, in the semiconductor device 100, the occurrence of leakage current between the first well 51 and the second well 52 can be more reliably suppressed. Furthermore, in the semiconductor device 100, the occurrence of leakage current between the first portion 41 of the second impurity region 40 and the first well 51 can be more reliably suppressed.

In the semiconductor device 100, the gate insulating film 80 of the first MOS transistor 111 may differ in thickness from the gate insulating film 80 of the second MOS transistor 112. Specifically, in the case where the voltage that is applied between the gate electrode 82 of the second MOS transistor 112 and the second well 52 is higher than the voltage that is applied between the gate electrode 82 of the first MOS transistor 111 and the first well 51, the gate insulating film 80 of the second MOS transistor 112 can be configured to be thicker than the gate insulating film 80 of the first MOS transistor 111. The second MOS transistor 112 to which the high voltage is applied can thereby be configured to have a higher breakdown voltage.

2. Method for Manufacturing a Semiconductor Device

Figure 4:
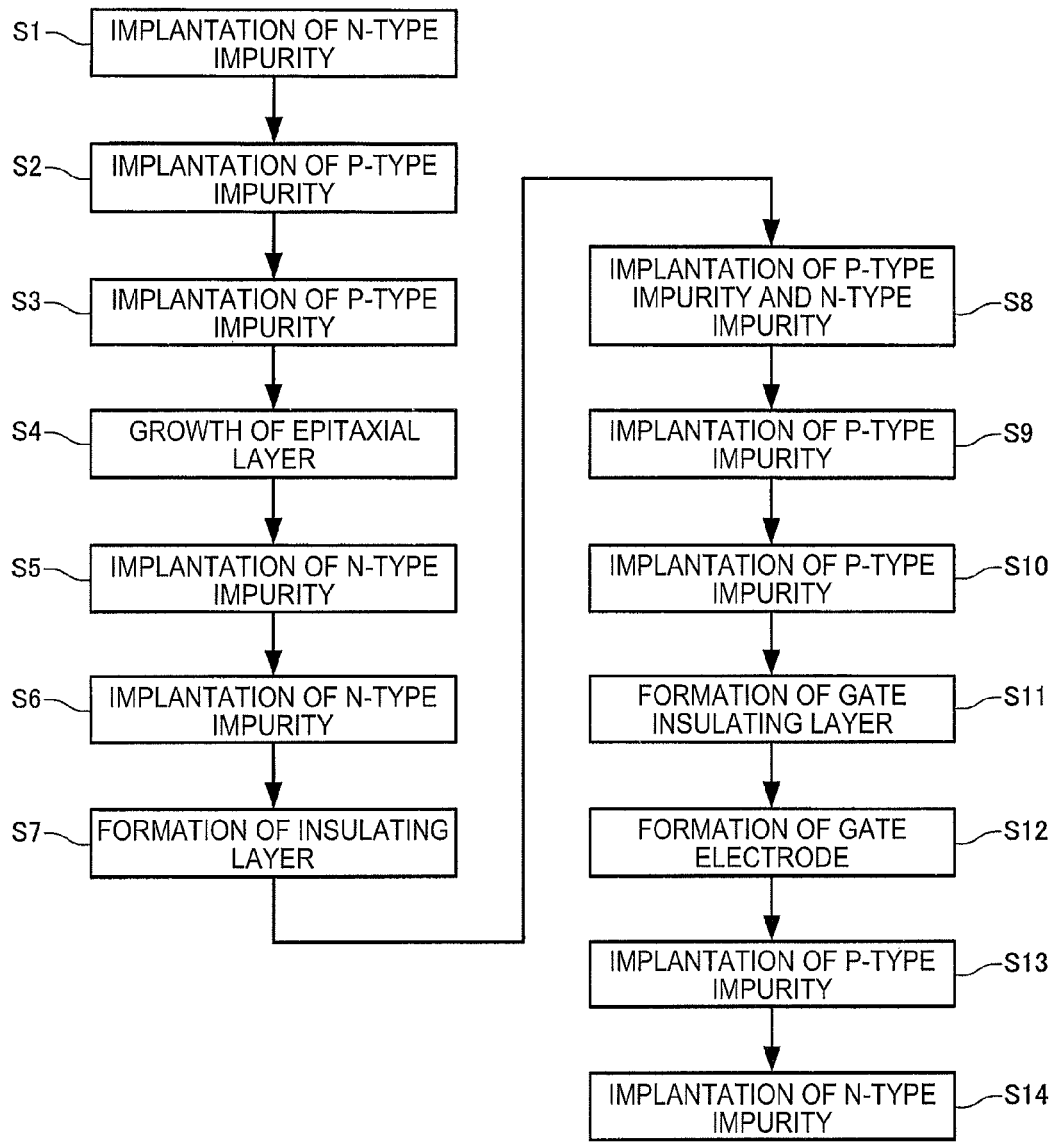
FIG. 4 is a flowchart for illustrating a method for manufacturing the semiconductor device according to the embodiment.

Next, a method for manufacturing the semiconductor device 100 according to the present embodiment will be described with reference to the drawings. FIG. 4 is a flowchart for illustrating a method for manufacturing the semiconductor device 100 according to the present embodiment. FIGS. 5 to 13 are cross-sectional views schematically showing processes for manufacturing the semiconductor device 100 according to the present embodiment.

Figure 5:
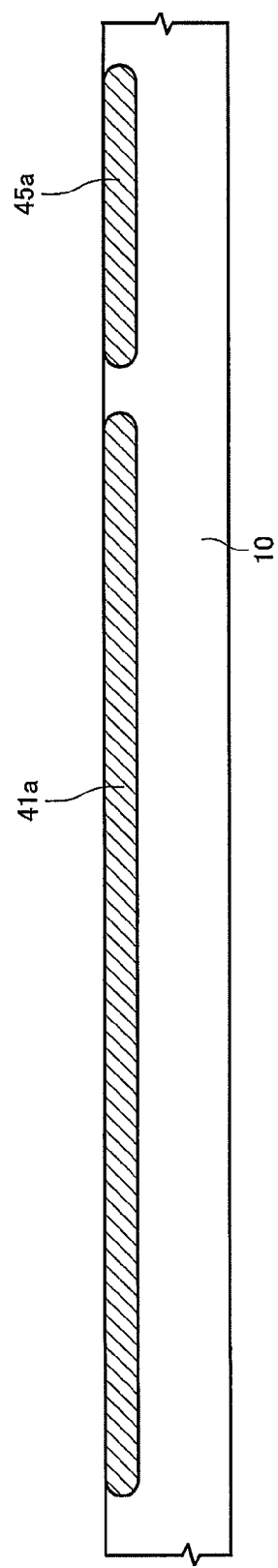
FIG. 5 is a cross-sectional view schematically showing a process for manufacturing the semiconductor device according to the embodiment.

As shown in FIG. 5, an N-type impurity is implanted to form an impurity region 41a that will become the first portion 41 of the second impurity region 40 and an impurity region 45a that will become the third portion of the third impurity region 44 in the semiconductor substrate 10 (S1). Specifically, the impurity regions 41a and 45a are formed by photolithography and implantation (ion implantation) of an impurity (antimony). After the impurity has been implanted, thermal diffusion is performed, for example.

Figure 6:
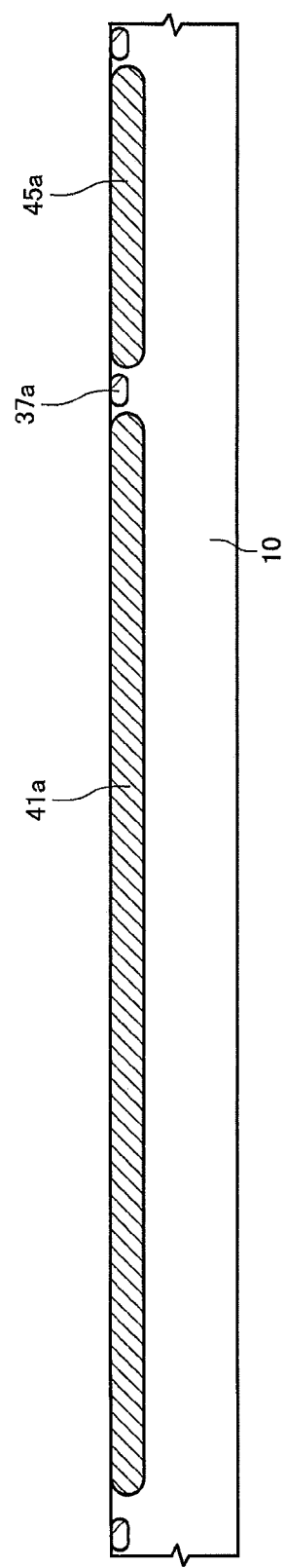
FIG. 6 is a cross-sectional view schematically showing a process for manufacturing the semiconductor device according to the embodiment.

As shown in FIG. 6, a P-type impurity is implanted to form an impurity region 37a that will become the fifth portion 37 of the fifth impurity region 36 in the semiconductor substrate 10 (S2). Specifically, the impurity region 37a is formed by photolithography and implantation of an impurity (boron). After the impurity has been implanted, thermal diffusion is performed, for example.

Figure 7:
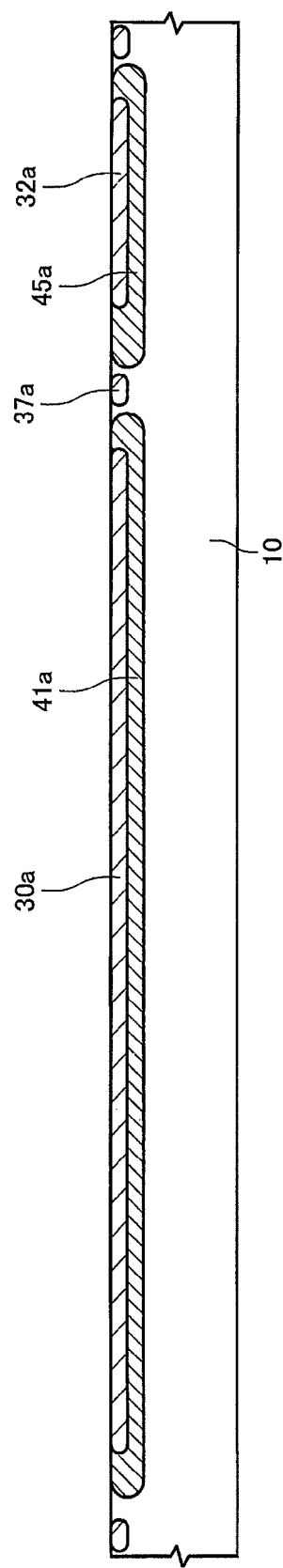
FIG. 7 is a cross-sectional view schematically showing a process for manufacturing the semiconductor device according to the embodiment.

As shown in FIG. 7, a P-type impurity is implanted to form an impurity region 30a that will become the first impurity region 30 in the impurity region 41a, and to form an impurity region 32a that will become the fourth impurity region 32 in the impurity region 45a (S3). Specifically, the impurity regions 30a and 32a are formed by photolithography and implantation of an impurity (boron). After the impurity has been implanted, thermal diffusion is performed, for example.

Note that the process (S2) of forming the impurity region 37a and the process (S3) of forming the impurity regions 30a and 32a may be performed in the same process.

Figure 8:
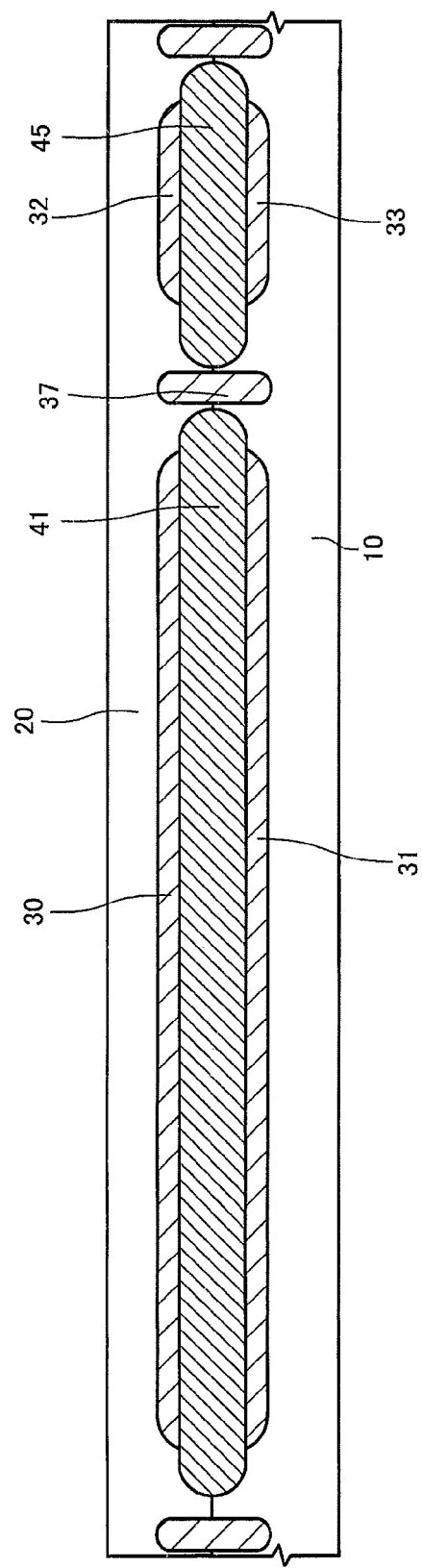
FIG. 8 is a cross-sectional view schematically showing a process for manufacturing the semiconductor device according to the embodiment.

As shown in FIG. 8, the epitaxial layer (single-crystal silicon thin film) 20 is grown by vapor phase epitaxy (epitaxially grown) on the semiconductor substrate 10 to form the first impurity region 30, the first portion 41 of the second impurity region 40, the third portion 45 of the third impurity region 44, the fourth impurity region 32, and the fifth portion 37 of the fifth impurity region (S4). Specifically, by growing the epitaxial layer 20 epitaxially on the semiconductor substrate 10, the impurity regions 30a, 32a, 37a, 41a and 45a diffuse into the epitaxial layer 20, and the impurity regions 30 and 32, the fifth portion 37, the first portion 41 and the third portion 45 are respectively formed by subsequent heat treatment. For example, the P-type impurity boron has a higher diffusion rate in thermal diffusion than the N-type impurity antimony.

The above processes (S1) to (S4) enable the impurity regions 30 and 32, the first portion 41 of the second impurity region 40, the third portion 45 of the third impurity region 44, and the fifth portion 37 of the fifth impurity region 36 to be formed in the epitaxial layer 20 that is grown epitaxially on the semiconductor substrate 10. The impurity regions 30 and 32 are formed to have a higher impurity concentration than the epitaxial layer 20.

Figure 9:
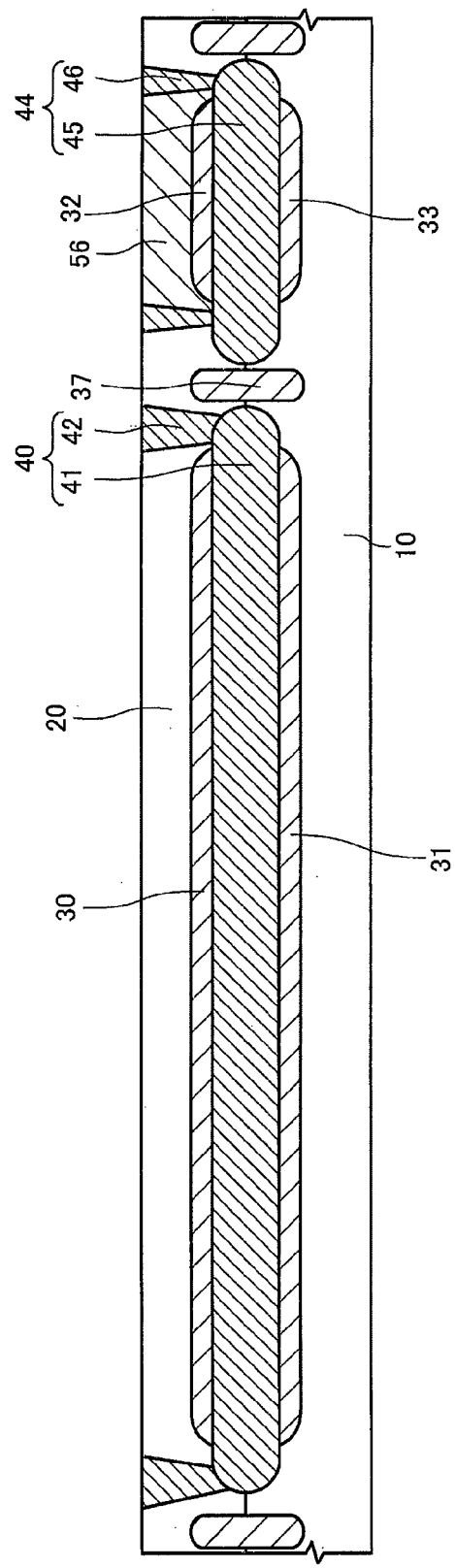
FIG. 9 is a cross-sectional view schematically showing a process for manufacturing the semiconductor device according to the embodiment.

As shown in FIG. 9, an N-type impurity is implanted to form the sixth well 56 in the epitaxial layer (S5). Specifically, the sixth well 56 is formed by photolithography and implantation of an impurity (phosphorus). After the impurity has been implanted, thermal diffusion is performed, for example.

Next, an N-type impurity is implanted in the epitaxial layer 20 to form the second portion 42 of the second impurity region 40 and the fourth portion 46 of the third impurity region 44 (S6). The second portion 42 and the fourth portion 46 are formed by photolithography and ion implantation of an impurity (phosphorus), for example. After the impurity has been implanted, thermal diffusion is performed, for example.

Note that the order in which the process (S5) for forming the sixth well 56 and the process (S6) for forming the second portion 42 and the third portion 45 are performed is not particularly limited.

Figure 10:
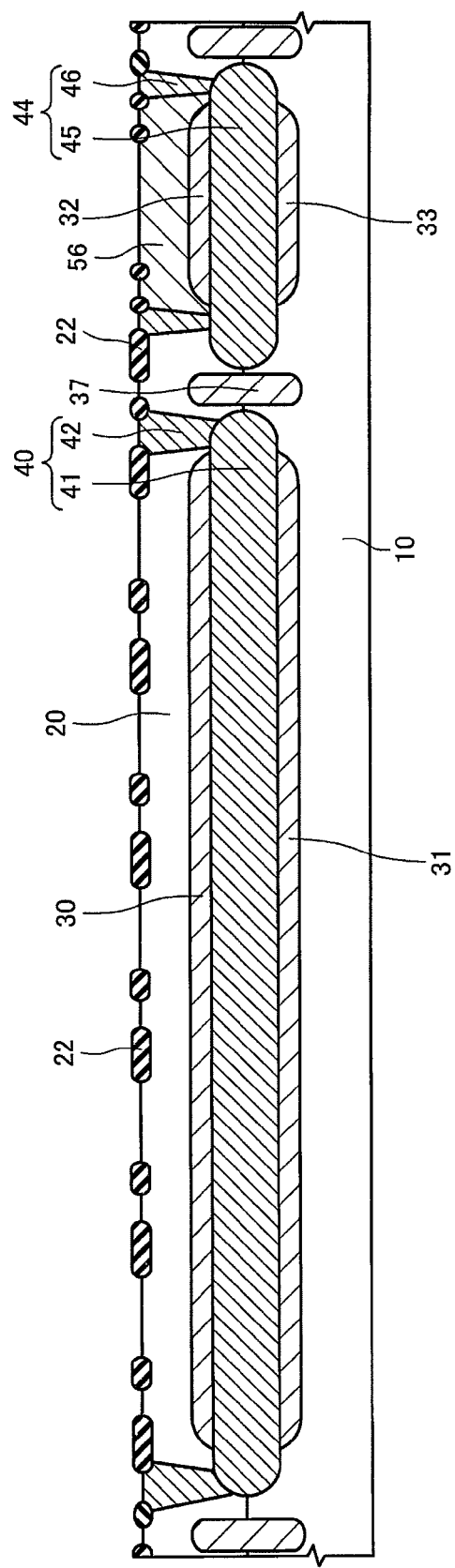
FIG. 10 is a cross-sectional view schematically showing a process for manufacturing the semiconductor device according to the embodiment.

As shown in FIG. 10, the insulating layer 22 is formed in the epitaxial layer 20 (S7). The insulating layer 22 is formed by the LOCOS method, for example.

Figure 11:
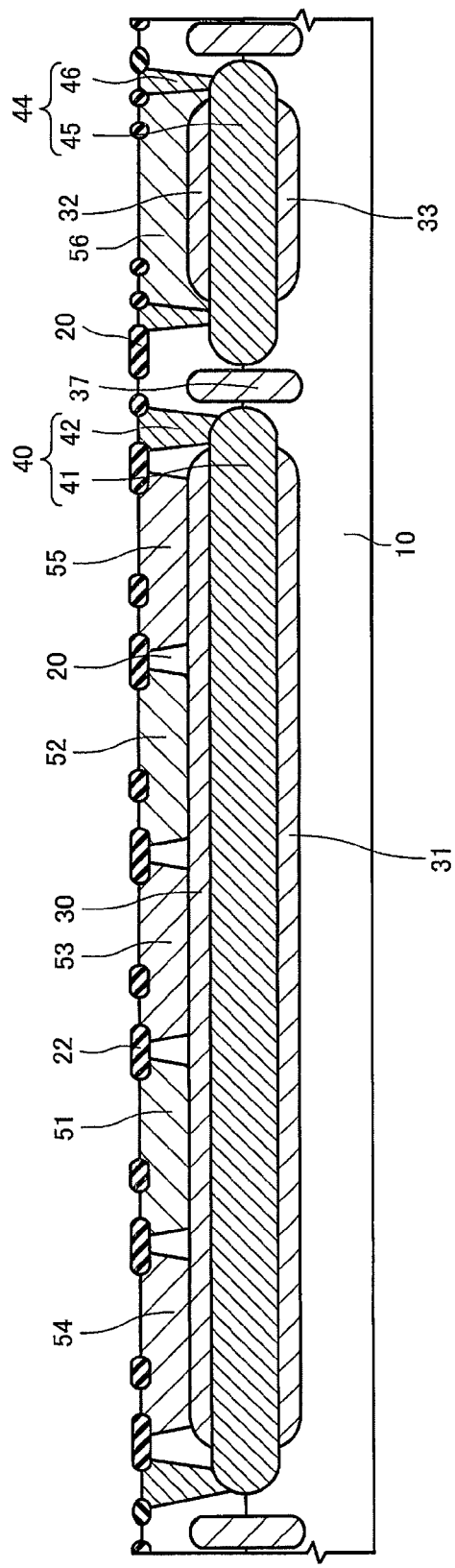
FIG. 11 is a cross-sectional view schematically showing a process for manufacturing the semiconductor device according to the embodiment.

As shown in FIG. 11, P-type impurities and N-type impurities are implanted to form the wells 51, 52, 53, 54 and 55 in the epitaxial layer 20 on the first impurity region 30 (S8). For example, the N-type wells 51 and 52 may be formed first, and then the P-type wells 53, 54 and 55 may be formed, or the P-type wells 53, 54 and 55 may be formed first, and then the N-type wells 51 and 52 may be formed. In the case of forming the N-type wells 51 and 52, phosphorus is implanted as the impurity, for example. In the case of forming the P-type wells 53, 54 and 55, boron is implanted as the impurity, for example. The wells 51, 52, 53, 54 and 55 are formed by photolithography and ion implantation of an impurity, for example. After the impurity has been implanted, thermal diffusion is performed, for example.

Figure 12:
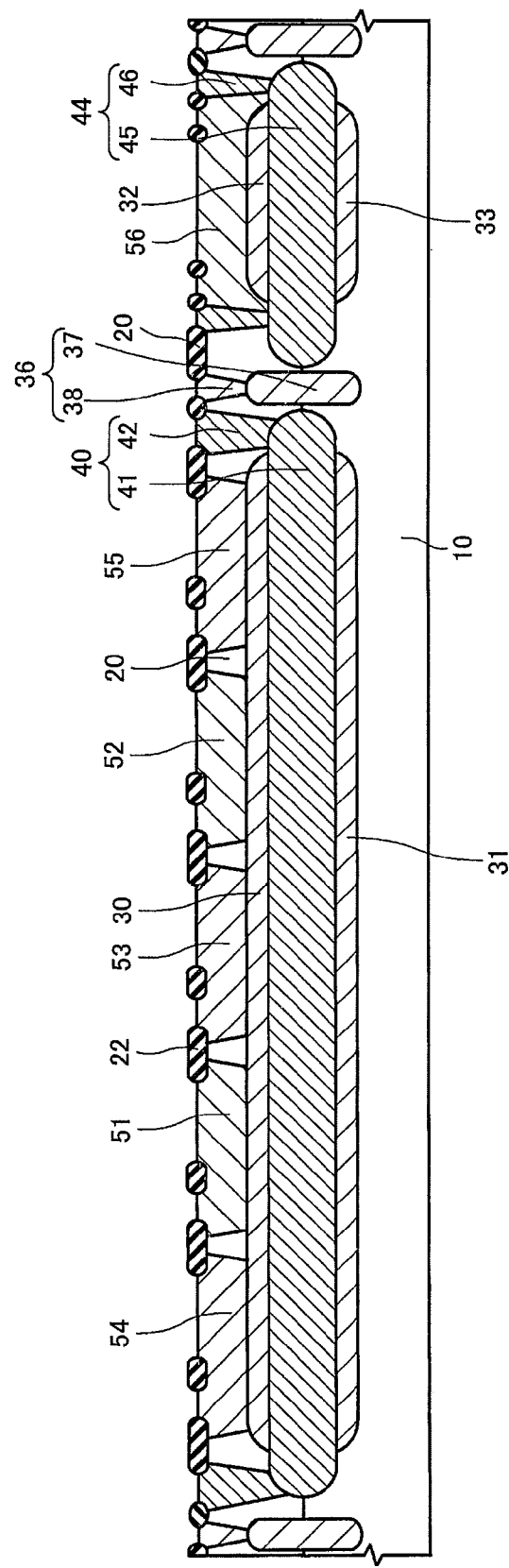
FIG. 12 is a cross-sectional view schematically showing a process for manufacturing the semiconductor device according to the embodiment.

As shown in FIG. 12, a P-type impurity is implanted to form the sixth portion 38 of the fifth impurity region 36 in the epitaxial layer 20 (S9). Specifically, the sixth portion 38 is formed by photolithography and implantation of an impurity (boron). After the impurity has been implanted, thermal diffusion is performed, for example.

Note that the sixth portion 38 of the fifth impurity region 36 may be formed in the same process as the wells 53, 54 and 55, for example.

Figure 13:
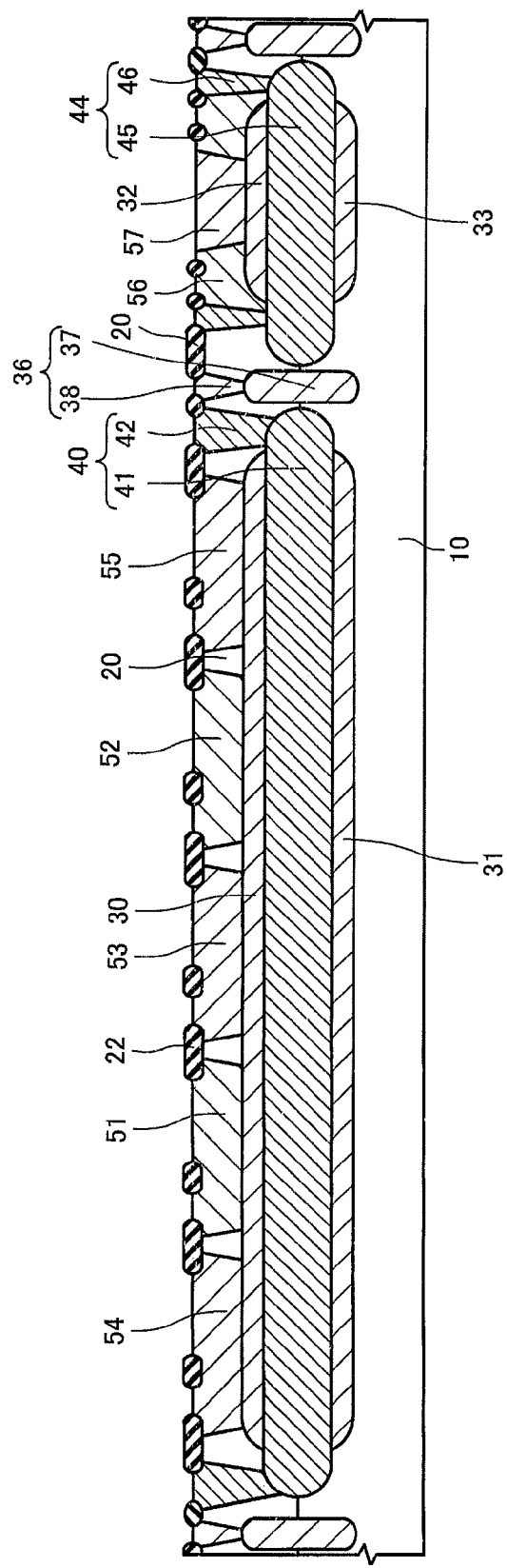
FIG. 13 is a cross-sectional view schematically showing a process for manufacturing the semiconductor device according to the embodiment.

As shown in FIG. 13, a P-type impurity is implanted to form the body region 57 in the sixth well 56 (S10). Specifically, the body region 57 is formed by photolithography and implantation of an impurity (boron). After the impurity has been implanted, thermal diffusion is performed, for example.

As shown in FIG. 1, the gate insulating film 80 is provided on the wells 51, 52, 53, 54, 55 and 56 and the body region 57 (S11). The gate insulating film 80 is formed by an oxidization method, for example.

Next, the gate electrodes 82 are provided on the gate insulating film 80 (S12). The gate electrodes 82 are formed by forming a polysilicon layer (not shown) using a CVD (Chemical Vapor Deposition) method, and patterning the polysilicon layer using photolithography and etching.

Next, a P-type impurity is implanted to form the impurity regions 60 and 62 in the wells 51 and 52, and to form the impurity region 6 in the wells 53, 54 and 55, the body region 57, and the sixth portion 38 of the fifth impurity region 36 (S13). Specifically, the impurity regions 6, 60, and 62 are formed by photolithography and implantation of an impurity (boron). After the impurity has been implanted, thermal diffusion is performed, for example. The impurity regions 60 and 62 and the impurity region 6 may be formed in the same process.

Next, an N-type impurity is implanted to form the impurity regions 70 and 72 in the wells 53, 54 and 55, to form the impurity region 72 in the sixth well 56, to form the impurity region 70 in the body region 57, and to form the impurity region 7 in the wells 51 and 52, the second portion 42 of the second impurity region 40, and the fourth portion 46 of the third impurity region 44 (S14). Specifically, the impurity regions 7, 70 and 72 are formed by photolithography and implantation of an impurity (phosphorus). After the impurity has been implanted, thermal diffusion is performed, for example. The impurity regions 70 and 72 and the impurity region 7 may be formed in the same process.

The above processes (S10) to (S14) enable the first MOS transistor 111 to be formed in the first well 51, the second MOS transistor 112 to be formed in the second well 52, and the third MOS transistor 113 to be formed in the third well 53, the fourth MOS transistor 114 to be formed in the fourth well 54, the fifth MOS transistor 115 to be formed in the fifth well 55, and the LDMOS transistors 121 and 122 to be formed in the sixth well 56.

Note that the order in which the process (S13) for forming the impurity regions 60 and 62 and the like and the process (S14) for forming the impurity regions 70 and 72 and the like are performed is not particularly limited.

Also, although an example was described in which the impurity regions 30a and 32a diffuse into the epitaxial layer 20 to form the impurity regions 30 and 32 by growing the epitaxial layer 20 epitaxially on the semiconductor substrate 10, the impurity regions 30 and 32 may be formed without forming the impurity regions 30a and 32a, by ion-implanting an impurity (e.g., boron) after growing the epitaxial layer 20 epitaxially on the semiconductor substrate 10. After the impurity has been implanted, thermal diffusion is performed, for example.

Also, the accelerating voltage and dose of each of the above impurity implantations, and the temperature and time of thermal diffusion for diffusing the impurities are determined as appropriate depending on the type of impurity, and the depth and impurity concentration of the impurity region that is formed using the impurity.

The semiconductor device 100 can be manufactured using the above processes.

With the method for manufacturing the semiconductor device 100, a semiconductor device 100 that is able to suppress the occurrence of leakage current between the first well 51 and the second well 52 with the first impurity region 30 can be manufactured. Furthermore, with the method for manufacturing the semiconductor device 100, a semiconductor device 100 that is able to suppress the occurrence of leakage current between the first well 51 and the second well 52 with the third well 53 can be manufactured.

3. Modification of Semiconductor Device 3.1. First Modification

Figure 14:
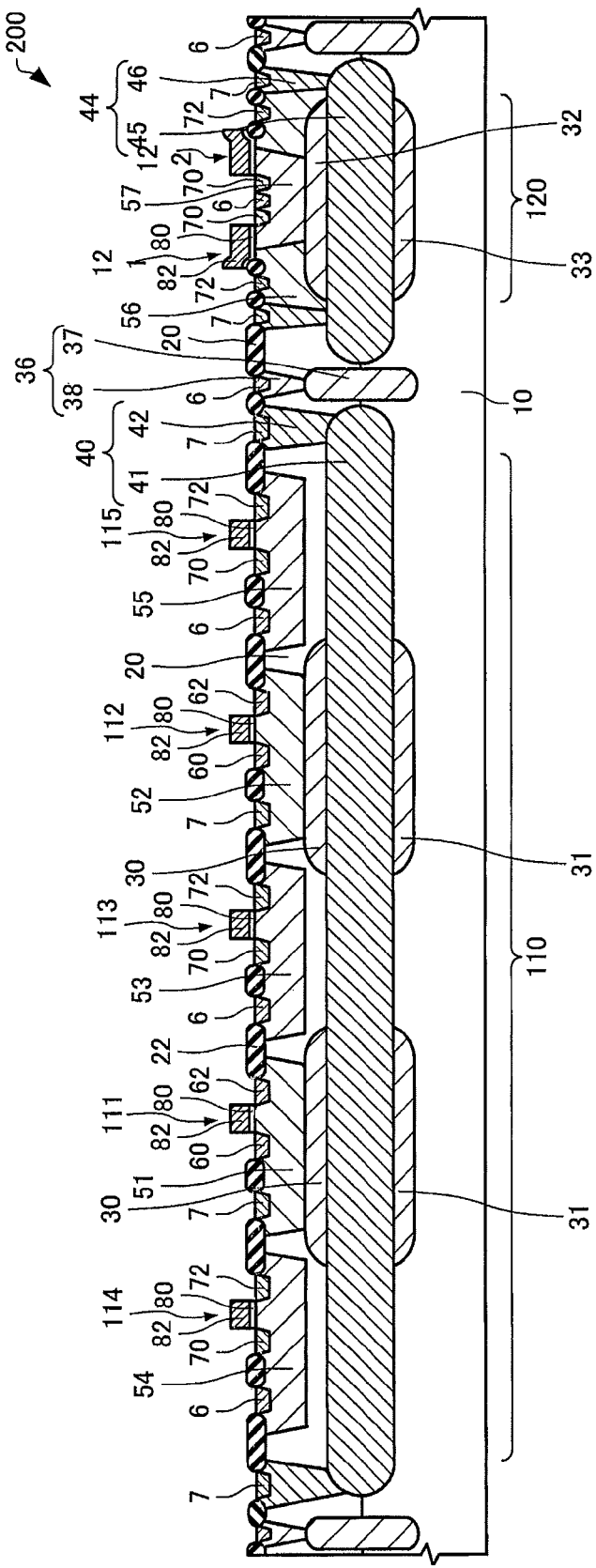
FIG. 14 is a cross-sectional view schematically showing a semiconductor device according to a first modification of the embodiment.

Next, a semiconductor device according to a first modification of the present embodiment will be described with reference to the drawings. FIG. 14 is a cross-sectional view schematically showing a semiconductor device 200 according to the first modification of the present embodiment.

Hereinafter, in the semiconductor device 200 according to the first modification of the present embodiment, the same reference signs are given to constituent members that have similar functions to members of the semiconductor device 100 according to the present embodiment, and a detailed description thereof is omitted. This similarly applies to a semiconductor device according to a second modification of the present embodiment and a semiconductor device according to a third modification of the present embodiment which will be discussed below.

In the abovementioned semiconductor device 100, one first impurity region 30 was provided, and this first impurity region was provided under the wells 51, 52, 53, 54 and 55, as shown in FIG. 1. In contrast, in the semiconductor device 200, two first impurity regions 30 are provided, as shown in FIG. 14. In the semiconductor device 200, one of the first impurity regions 30 is provided under the first well 51, and the other first impurity region 30 is provided under the second well 52.

3.2. Second Modification

Figure 15:
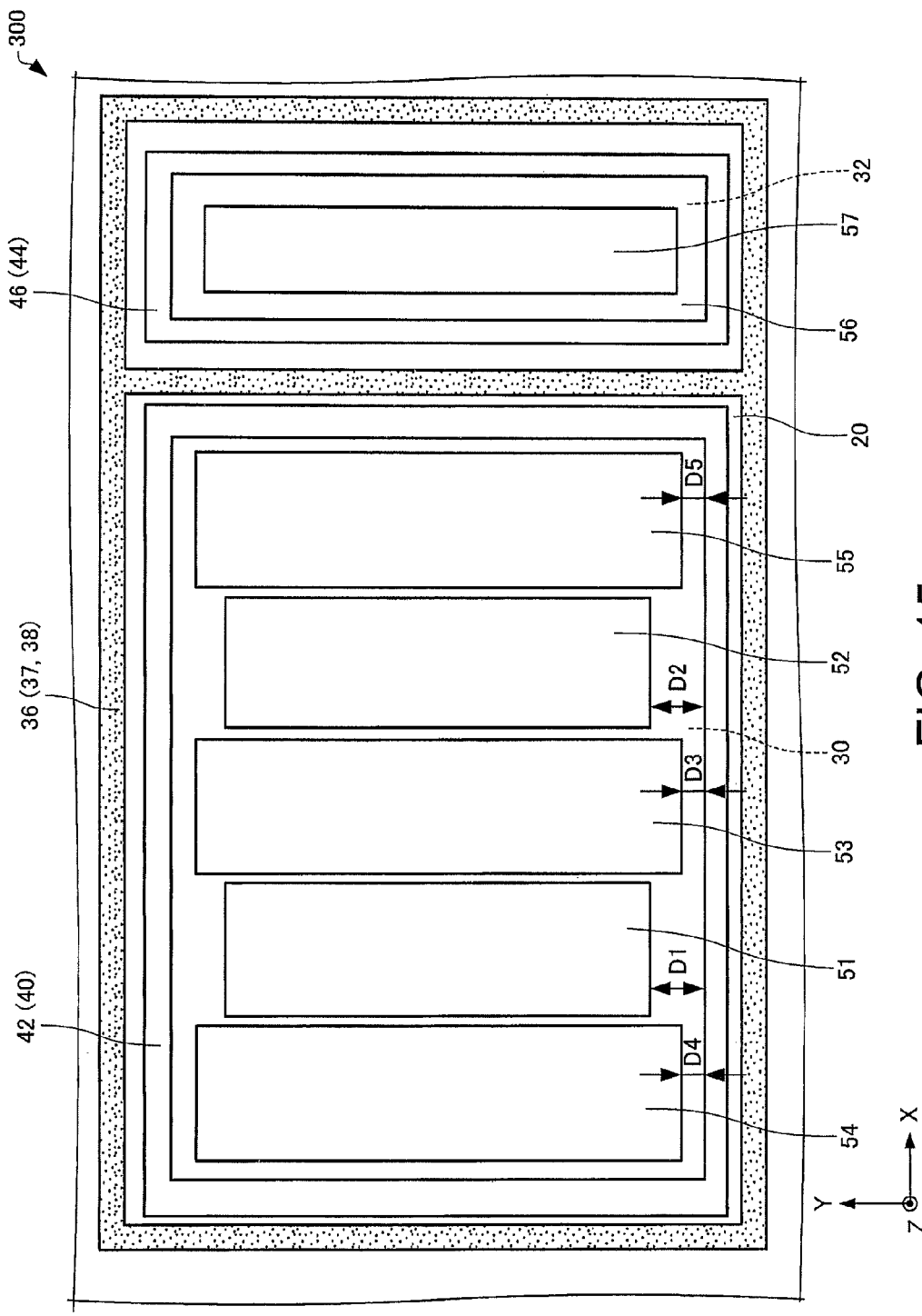
FIG. 15 is a plan view schematically showing a semiconductor device according to a second modification of the embodiment.

Next, a semiconductor device according to a second modification of the present embodiment will be described with reference to the drawings. FIG. 15 is a plan view schematically showing a semiconductor device 300 according to the second modification of the present embodiment. Note that, in FIG. 15, the X-axis, the Y-axis and the Z-axis are illustrated as three axes that intersect each other orthogonally.

In the abovementioned semiconductor device 100, the wells 51, 52, 53, 54 and 55 are all the same size in the Y-axis direction, as showed to FIG. 2. In contrast, in the semiconductor device 300, as shown in FIG. 15, the size of the wells 51 and 52 in the Y-axis direction is smaller than the size of the wells 53, 54 and 55 in the Y-axis direction. In the illustrated example, the wells 51 and 52 are the same size as each other in the Y-axis direction, and the wells 53, 54 and 55 are the same size as each other in the Y-axis direction.

In the semiconductor device 300, the distance (shortest distance) D1 in the Y-axis direction between the first well 51 and the second portion 42 of the second impurity region 40 in plan view is greater than the distance (shortest distance) D3 between the third well 53 and the second portion 42, the distance (shortest distance) D4 between the fourth well 54 and the second portion 42, and the distance (shortest distance) D5 between the fifth well 55 and the second portion 42. Furthermore, in the semiconductor device 300, the distance (shortest distance) D2 in the Y-axis direction between the second well 52 and the second portion 42 in plan view is greater than the distances D3, D4 and D5.

In the semiconductor device 300, the occurrence of leakage current between the first well 51 and the second portion 42 of the second impurity region 40, and between the second well 52 and the second portion 42 can be suppressed, while suppressing a reduction in the area of the wells 53, 54 and 55 in plan view.

Note that, in the semiconductor device 300, two first impurity regions 30 may be provided, one of which may be provided under the first well 51, and the other of which may be provided under the second well 52, similarly to the semiconductor device 200 shown in FIG. 14.

3.3. Third Modification

Figure 16:
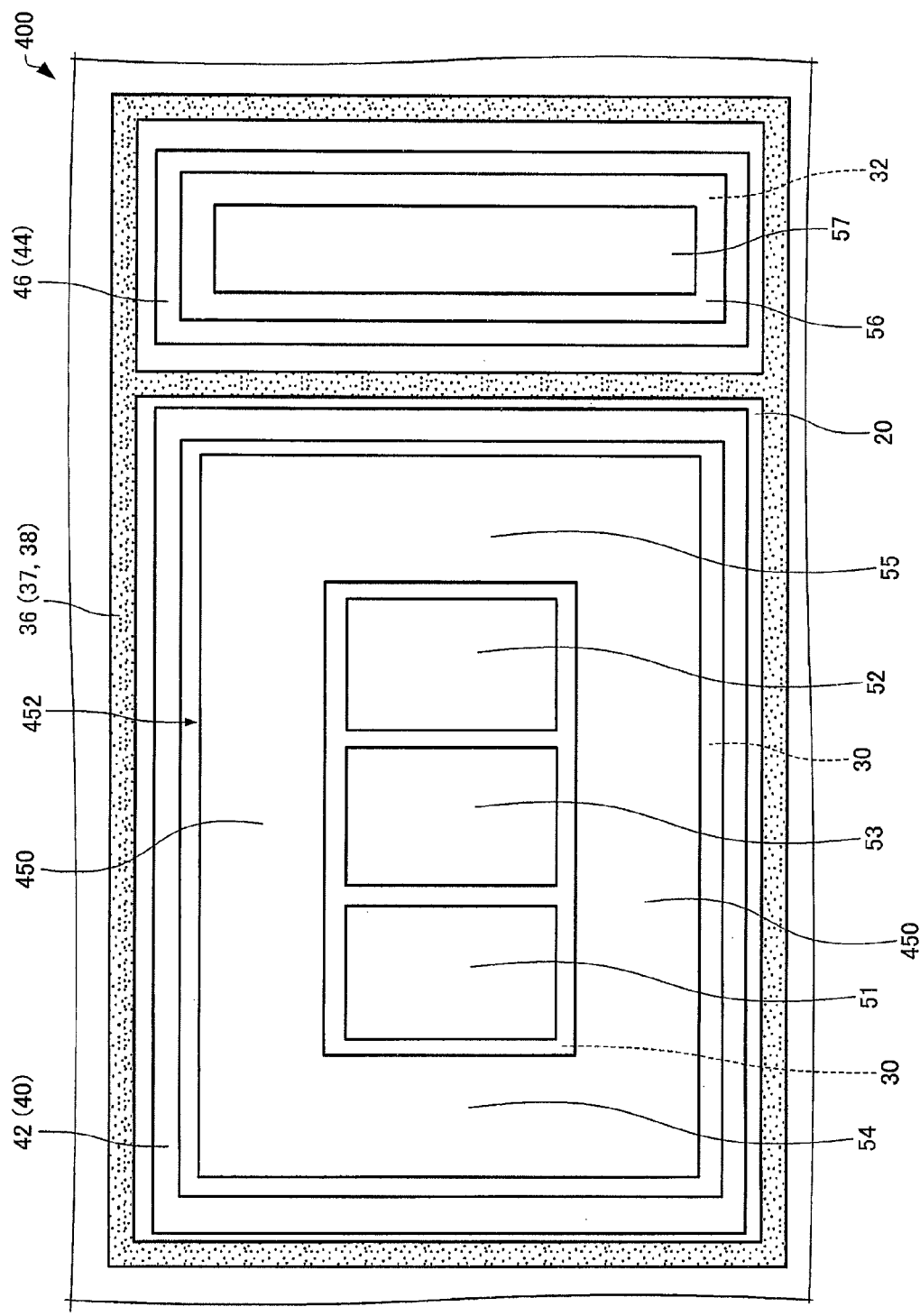
FIG. 16 is a plan view schematically showing a semiconductor device according to a third modification of the embodiment.

Next, a semiconductor device according to a third modification of the present embodiment will be described with reference to the drawings. FIG. 16 is a plan view schematically showing a semiconductor device 400 according to the third modification of the present embodiment.

The semiconductor device 400 differs from the abovementioned semiconductor device 100 in that the fourth well 54 and the fifth well 55 are connected by a connecting well 450, as shown in FIG. 16.

The connecting well 450 is provided in the epitaxial layer 20. The connecting well 450 is a well of the first conductivity type (e.g., P-type). The wells 54 and 450 are integrally formed (formed in the same process), and form an annular well 452. The planar shape of the annular well 452 is annular, as shown in FIG. 16. The wells 51, 52 and 53 are surrounded by the annular well 452 in plan view.

In the semiconductor device 400, the annular well 452 enables the occurrence of leakage current between the first well 51 and the second portion 42 of the second impurity region 40 and between the second well 52 and the second portion 42 to be suppressed.

Note that, in the semiconductor device 400, two first impurity regions 30 may be provided, one of which may be provided under the first well 51, and the other of which may be provided under the second well 52, similarly to the semiconductor device 200 shown in FIG. 14.

The abovementioned embodiments and modifications are intended as examples, and the invention should not be construed as being limited thereto. For example, the embodiments and modifications can also respectively be combined as appropriate.

The invention includes substantially the same configuration as the configuration described in the embodiments (e.g., a configuration having the same functions and methods or a configuration having the same objects and effects). Also, the invention includes a configuration in which nonessential portions of the configuration described in the embodiments have been replaced. Also, the invention includes a configuration that can achieve the same operations and effects as the configuration described in the embodiments or a configuration that attains the same objects. Also, the invention includes a configuration in which well-known technologies have been added to the configuration described in the embodiments.

What is claimed is:

1. A semiconductor device comprising:
   a semiconductor substrate;
   an epitaxial layer of a first conductivity type grown epitaxially on the semiconductor substrate;
   a first well of a second conductivity type provided in the epitaxial layer and to which a first potential is applied;
   a second well of the second conductivity type provided in the epitaxial layer and to which a second potential that differs from the first potential is applied;
   a third well of the first conductivity type provided in the epitaxial layer between the first well and the second well;

a first impurity region of the first conductivity type provided in the epitaxial layer under the first well;
a first MOS transistor provided in the first well;
a second MOS transistor provided in the second well;
a third MOS transistor provided in the third well;
a second impurity region of the second conductivity type provided in the epitaxial layer;
a fourth well of the first conductivity type provided in the epitaxial layer between the second portion and the first well;
a fifth well of the first conductivity type provided in the epitaxial layer between the second portion and the second well;
a fourth MOS transistor provided in the fourth well; and
a fifth MOS transistor provided in the fifth well,
the first impurity region having a higher impurity concentration than the epitaxial layer; and
the second impurity region including:
  a first portion provided under the first impurity region; and
  a second portion connected to the first portion and provided surrounding the first well, the second well and the third well in plan view.

2. The semiconductor device according to claim 1, wherein the first impurity region is provided under the second well and under the third well.

3. The semiconductor device according to claim 1, comprising:
a sixth well of the second conductivity type provided in the epitaxial layer outside the second portion in plan view;
a third impurity region of the second conductivity type provided surrounding the sixth well in plan view; and
an LDMOS transistor provided in the sixth well.

4. The semiconductor device according to claim 1, wherein the first well is provided inside an outer edge of the first impurity region in plan view.

5. The semiconductor device according to claim 1, wherein a gate insulating film of the first MOS transistor differs in thickness from a gate insulating film of the second MOS transistor.

6. A semiconductor device comprising:
a semiconductor substrate;
an epitaxial layer of a first conductivity type disposed on the semiconductor substrate;
a first well of a second conductivity type provided in the epitaxial layer and to which a first potential is applied;
a second well of the second conductivity type provided in the epitaxial layer and to which a second potential that differs from the first potential is applied;
a third well of the first conductivity type provided in the epitaxial layer between the first well and the second well;
a first impurity region of the first conductivity type provided in the epitaxial layer under the first well;
a second impurity region of the first conductivity type provided in the epitaxial layer under the second well;
a fourth well of the first conductivity type provided in the epitaxial layer between the second portion and the first well;
a fifth well of the first conductivity type provided in the epitaxial layer between the second portion and the second well;
a first MOS transistor provided in the first well;
a second MOS transistor provided in the second well;
a third MOS transistor provided in the third well;
a fourth MOS transistor provided in the fourth well; and
a fifth MOS transistor provided in the fifth well,
a third impurity region of the second conductivity type provided in the epitaxial layer,
the third impurity region includes:
  a first portion provided under the first impurity region; and
  a second portion connected to the first portion and provided surrounding the first well, the second well and the third well in plan view,
an LDMOS well of the second conductivity type provided in the epitaxial layer outside the second portion in plan view;
a fourth impurity region of the second conductivity type provided surrounding the LDMOS well in plan view; and
an LDMOS transistor provided in the LDMOS well.

7. The semiconductor device according to claim 1, comprising a fourth impurity region provided under the first portion.

8. The semiconductor device according to claim 1, comprising a fifth impurity region of the first conductivity type provided surrounding the first well, the second well, the third well, the fourth well and the fifth well in plan view.

9. The semiconductor device according to claim 8, the fifth impurity region including:
a fifth portion provided in the semiconductor substrate and the epitaxial layer; and
a sixth portion provided extending from the fifth portion to the upper surface of the epitaxial layer.

10. The semiconductor device according to claim 9, comprising a sixth impurity region of the first conductivity type provided in the sixth portion, the sixth impurity region having a higher impurity concentration than the fifth impurity region.

11. The semiconductor device according to claim 9, comprising a sixth impurity region of the first conductivity type provided in the third, the fourth and the fifth well having a higher impurity concentration than the third, the fourth and the fifth well.

12. The semiconductor device according to claim 1, comprising a seventh impurity region of the second conductivity type provided in the first well and the second well having a higher impurity concentration than the first and the second well.

13. The semiconductor device according to claim 1, wherein none of the first well, the second well, the third well, the fourth well and the fifth are connected to each other.

14. The semiconductor device according to claim 1, wherein the fourth well and the fifth well are not connected to the second portion.

15. The semiconductor device according to claim 1, the first portion having a higher impurity concentration than the first well.

16. The semiconductor device according to claim 3, the fifth impurity region provided to surround the sixth well in plan view.

17. The semiconductor device according to claim 3, the fifth impurity region provided between the second impurity region and the third impurity region.

* * * * *